(12) United States Patent
Thiruvengadam et al.

(10) Patent No.: US 9,551,741 B2
(45) Date of Patent: Jan. 24, 2017

(54) CURRENT TESTS FOR I/O INTERFACE CONNECTORS

(75) Inventors: Bharani Thiruvengadam, Beaverton, OR (US); Mladenko Vukic, Portland, OR (US); Tak M. Mak, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 13/977,648

(22) PCT Filed: Nov. 23, 2011

(86) PCT No.: PCT/US2011/062124
§ 371 (c)(1),
(2), (4) Date: Jun. 28, 2013

(87) PCT Pub. No.: WO2013/077882
PCT Pub. Date: May 30, 2013

(65) Prior Publication Data
US 2013/0271167 A1    Oct. 17, 2013

(51) Int. Cl.
*G01R 31/26*    (2014.01)
*G01R 31/30*    (2006.01)
*G01R 31/317*   (2006.01)
*G01R 35/00*    (2006.01)

(52) U.S. Cl.
CPC ....... *G01R 31/2607* (2013.01); *G01R 31/3008* (2013.01); *G01R 31/31716* (2013.01); *G01R 35/005* (2013.01)

(58) Field of Classification Search
CPC ................ G01R 31/2607; G01R 31/28; G01R 31/31716; G01R 31/3004; G01R 31/3008; G01R 31/3012; G01R 35/005; G01R 31/02; G01R 31/024; G01R 31/025
See application file for complete search history.

(56) References Cited

U.S. PATENT DOCUMENTS

| | | | | |
|---|---|---|---|---|
| 5,696,773 A | * | 12/1997 | Miller | G01R 31/31924 327/334 |
| 5,721,496 A | | 2/1998 | Farnworth et al. | |
| 5,826,004 A | * | 10/1998 | Bae | G01R 31/3185 710/12 |
| 6,008,664 A | * | 12/1999 | Jett | G01R 19/0023 324/762.02 |
| 6,140,832 A | * | 10/2000 | Vu et al. | 324/759.01 |

(Continued)

FOREIGN PATENT DOCUMENTS

JP    59-051368    3/1984

OTHER PUBLICATIONS

PCT Search Report, PCT/US2011/062124, Intel Corporation, Aug. 14, 2012, 9 pages.

*Primary Examiner* — Minh N Tang
*Assistant Examiner* — David Frederiksen
(74) *Attorney, Agent, or Firm* — Blakely, Sokoloff, Taylor & Zafman LLP (57) ABSTRACT

Current tests for I/O interface connectors are described. In one example a test may include applying a forced energy to a first pin of an interface of a data communications bus of an integrated circuit on a die, sensing the energy caused by the forced energy at a second pin of the interface, and comparing the forced energy and the sensed energy to determine an amount of current leaked by at least a portion of the interface.

19 Claims, 6 Drawing Sheets

(56) References Cited

U.S. PATENT DOCUMENTS

| | | | |
|---|---|---|---|
| 6,255,842 B1* | 7/2001 | Hashimoto | 324/76.11 |
| 7,348,790 B2* | 3/2008 | Arabi et al. | 324/762.02 |
| 8,634,264 B2* | 1/2014 | Yamada | 365/201 |
| 2006/0214276 A1 | 9/2006 | Kazi et al. | |
| 2007/0252613 A1* | 11/2007 | Hsu | G01R 31/2884 324/750.3 |
| 2008/0151620 A1* | 6/2008 | Chen | G11C 16/0475 365/185.3 |
| 2008/0209285 A1* | 8/2008 | Acharyya | G01R 31/31857 714/724 |
| 2009/0185320 A1* | 7/2009 | Meyer | G01R 31/025 361/78 |
| 2010/0013503 A1* | 1/2010 | Huebner | 324/754 |
| 2010/0013510 A1 | 1/2010 | Fujiwara et al. | |
| 2010/0125429 A1* | 5/2010 | Yamada | 702/64 |
| 2010/0257492 A1* | 10/2010 | Joshi et al. | 716/1 |
| 2011/0057707 A1* | 3/2011 | Bronczyk et al. | 327/332 |
| 2012/0008384 A1* | 1/2012 | Li | G11C 29/02 365/185.2 |

\* cited by examiner

CURRENT TESTS FOR I/O INTERFACE CONNECTORS

CROSS-REFERENCE TO RELATED APPLICATION

This patent application is a U.S. National Phase Application under 35 U.S.C. §371 of International Application No. PCT/US2011/062124, filed Nov. 23, 2011, entitled "CURRENT TESTS FOR I/O INTERFACE CONNECTORS".

FIELD

The present description relates to the field of integrated circuit test and, in particular, to testing data communications interfaces using applied energy, such as voltages or currents.

BACKGROUND

Leakage tests are used to test integrated circuits after they have been fabricated to find defects and to improve manufacturing processes, handling processes and packaging processes. Such integrated circuits are formed on a die and typically installed into a package. The die may be tested before or after it is installed into a package. The package typically has pins or bumps to connect to a circuit board or a socket and so the die may be tested directly inside the package or after being placed onto a circuit board or into a socket. DC (Direct Current) tests for I/O (Input Output) pins include leakage tests, Vix/Vox tests and Opens/Shorts test. Vix/Vox is used to characterize the DC behavior of the transmitter and receiver interfaces. Vix refers to the upper and lower voltage limits of an input and Vox refers to the upper and lower limits of an output. Opens/shorts testing tests for the presence of open circuits and short circuits. This testing can be used to ensure the reliability of the package assembly process and the connectivity of bumps to mapped pins. Bumps on the inside of a package connect to pins on an integrated circuit.

No Touch Leakage (NTL) tests have been used to save on tooling costs when the number of pins to be tested on an integrated circuit package is more than is available on commonly available test modules. One NTL test looks at RC (Resistance-Capacitance) decay and another looks at DC bias, however, both tests suffer from process variability, have difficulty in achieving high accuracy without significant effort and have very long test times, approaching several milliseconds.

ICDCT is a Reduced Pin Count Test (RPCT) as it connects to tens to hundreds of Pin Under Test via couple of pins. There are several sources of error in applying analog bus tests to DC testing. The sources of error include the IR (Voltage=Current*Resistance product) drop that occurs based on the pin location on the bus that is being tested, the leakage of the pins used to make contact to conduct the tests and the leakage of multiplexers that receive the test signal. The IR drop can easily reach 100 mv or higher making it challenging to reliably determine upper and lower functioning limits across all of the I/O (Input/Output) pins of a multiple pin interface. The multiplexer leakage and pin leakage can reach 100's of micro amps. This can be as large as the pin leakage that is to be measured, obscuring the test results.

The limitations of NTL and RPCT methods have reduced their use. As a result, testers with PMU (Parametric Measurement Unit) are often used for leakage tests. However, PMU testers must be independently connected to each pin that is to be tested, increasing the cost. The analog measurement increases the time required for the tests.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the present invention provide DC tests through an indirect connection with an I/O interface and allow measurement errors and IR drops to be determined or accounted for. In some embodiments of the invention, an observability port is added with new process improvements and error calibration. These test methods are accurate and robust. Embodiments of the invention allow for increasing test parallelism in testing, reduction in the number of relays used in the tester interface unit and reducing DPM (Defects per Million) by allowing defect coverage for I/Os in links embedded within a package. Reducing relays reduces reliability risks and eliminates signal integrity issues and helps scale AC (Alternating Current) tests to be run at higher speeds. Defect coverage in embedded links helps contain DPM (Defects per Million).

As a result, errors from various sources in using an analog test bus for DC testing are reduced. These error sources include the IR drop differences from different pin locations on the test bus, observability and controllability pin leakage and multiplexer leakage.

Embodiments of the present invention reduce the pin count on an external tester. In one example using OPIO (On Package I/O), the tester pin connection can be reduced from over 150 pins to a mere 2 pins. This allows for more tests to be performed at the same time while still allowing defects to be detected. Test costs can be further reduced by avoiding the need for and use of relays. As described below, the relays are avoided by using the same TIU/SIU (Tester Interface Unit/System Interface Unit) connection for loopback tests and for leakage tests. Removing the relays also improves signal integrity for high speed loopback signal testing.

The typical DC (Direct Current) I/O interface tests are Leakage, Vix/Vox and Opens/Shorts tests. The leakage tests look for leakage at the external pin interface into other parts of the integrated circuit. Vix/Vox is used for DC characterization of the transmitter and receiver and opens/shorts tests are used to ensure the reliability of the assembly process and connectivity of the bumps to mapped pins.

Test Configurations

Figure 1:
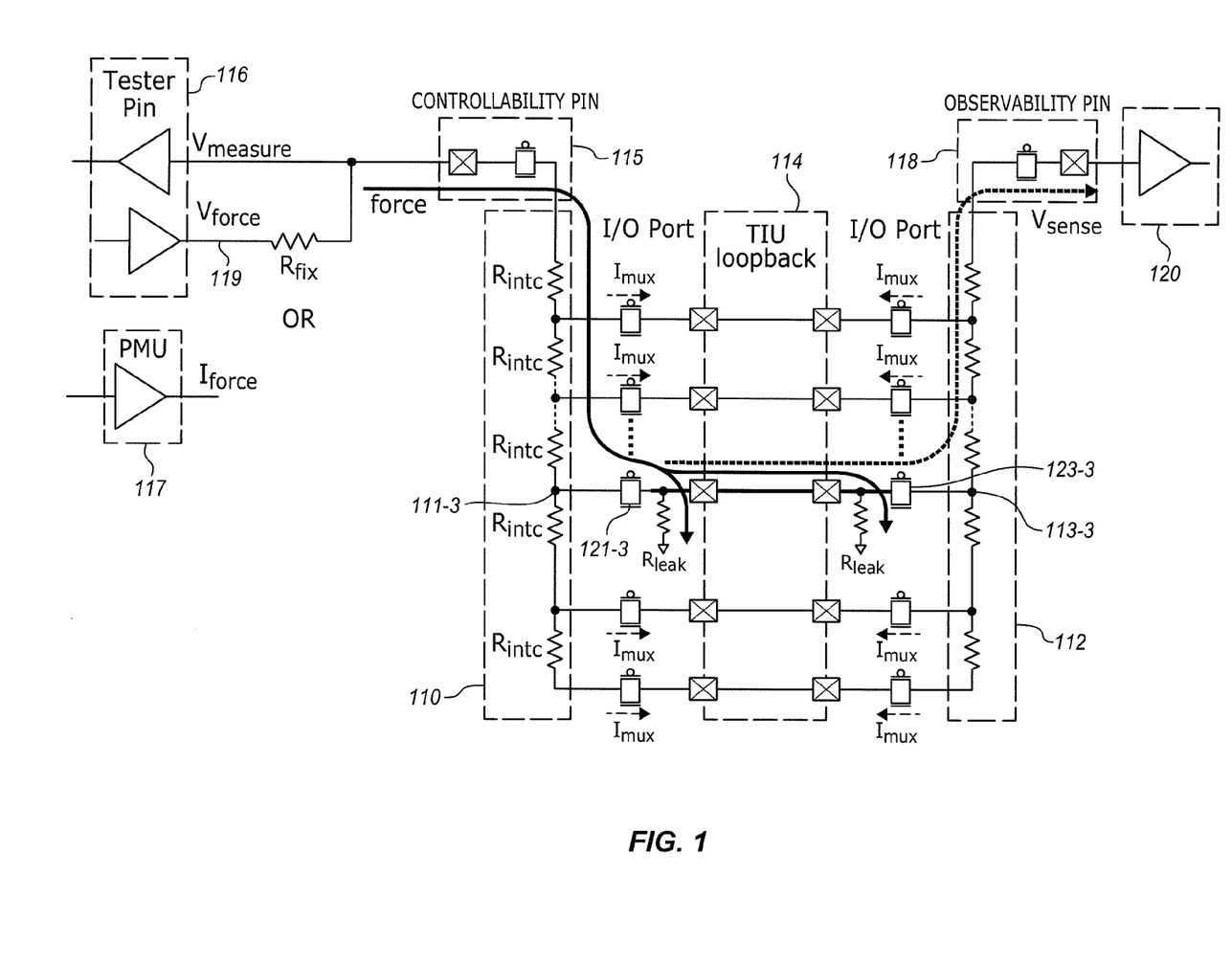
FIG. 1 is a diagram of a DC test equipment configuration for a data interface according to an embodiment of the invention.

A direct connect leakage test places analog components on the testers i.e. PMU to test the analog characteristics of the I/O interface. This removes any impact from the operation and digital aspects of the integrated circuit from the test. Referring to FIG. 1, an integrated circuit I/O interface presents two sets of interface pins. The figure is just one configuration out of many for illustrating the concept. On the transmit side 110, there are one or more data and clock output pins 111. Similarly, the paths within the bounded box indicated as the transmit 110 or receive 112 side of the interface represent the two analog test buses. $R_{intc}$, a resistance shown as connecting each pin on each side, represents the interconnect resistance, that is the inherent resistance between each of the pins of the I/O interface.

The bus to be tested is accessed via a controllability pin 115 from a test voltage source 116 or current source 117 and an observability pin 118 that connects to a voltage detector 120. The test voltage source and detector may both be components of a single external tester. The controllability pin and the observability may be integrated on the die being tested as pads, pins or bumps coupled to the appropriate circuitry. These pins connect to the on-die pins through the analog test bus.

Each pin interface includes a pass gate 121-3 on the transmit side and a pass gate 123-3 for each pin on the receive side. The pass gates are multiplexers that allow each pad or pin to be accessed one by one or in groups by connecting or disconnecting different pins on either the transmit side 110 or the receive side 112 together. The pass gate multiplexers are formed on the die that has the data bus using low leakage devices. The multiplexers are located close to the bumps or pads on the die that carry the data bus connections.

Relays exist in the TIU loopback 114 in order to switch between an IOLB (Input/Output Loopback) test mode and a connection mode for a leakage test. The benefit of the analog test bus is that the the TIU loopback connection is kept intact (no switching needed) for performing both an AC (Alternating Current) IOLB and DC leakage testing. Hence, the relays are not removed from this configuration. In the loopback configuration shown in FIG. 1, signals on the transmit pins 111 are looped back to the corresponding receive pin 113. The leakage for the two pins, transmit and receive, is screened at one time while the loopback connection is present.

The observability pin 118 allows the IR (Current-Resistance) drop between a transmit and receive pin to be determined. The IR drop varies based on pin location. The sensed voltage applied to the voltage detector 120 through the observability pin will be equal to the pin voltage reduced by any current drawn by the leakage in the observability pin and/or multiplexor leakage. While in a typical leakage test, one pin of an interface is tested while the other pins on that same interface are tri-stated, this still allows for uncontrolled errors. In the examples described below, either the I/O's or the leaker (a high K resistor used to bias a node to a voltage) may be used to actively drive the I/O side of the disabled analog multiplexers 121, 123 to the same voltage as the analog test bus. The multiplexers each have a leakage current indicated as $I_{mux}$. By keeping the potential difference across each multiplexer close to zero, the drain to source component of leakage is greatly reduced. This can be a dominant source of leakage. The I/O side of the multiplexer can be driven to equipotential (with reference to the test bus side) by the driver in the I/O's or the leaker structure or in any of a variety of other ways.

The configuration of FIG. 1, is particularly suitable for testing DC coupled near end loopback. Such a test may be applied to a variety of data communication buses including DDR (Double Data Rate Memory), QPI (Quick Path Interconnect) and DMI (Direct Media Interface). A forced current $I_{force}$ 117 or a forced voltage $V_{force}$ 116 may be applied to a selected pin. Applying a current allows for more accurate testing results, but may overload (reliability) certain circuits. Applying a fixed voltage with the tolerance limits of the die or tester components avoids the overload risk. The current may be driven to an expected leakage value and the detected voltage, $V_{sense}$, is measured and compared on ATE (Automated Test Equipment) to determine whether the sensed voltage meets a pass/fail criterion. The polarity of the forced current will depend on the leakage path being measured. Changing the polarity allows the leakage to $V_{cc}$ or $V_{ss}$ to be measured. The forced current can also be used in a feedback loop and driven until $V_{sense}=V_{pin}=$supply or ground, i.e. the sensed voltage is equal to the pin voltage and equal to the supply or ground voltage depending on the test.

While the tester can force voltage or current and measure current or voltage respectively at the controllability pin, a fixture resistor, $R_{fix}$, exists between the forced voltage source and the controllability pin to convert an analog voltage measurement into a a trip point based pass or fail measurement. This reducing the amount of time required to test each pin. By forcing a voltage Vforce at the tester channel 119 and measuring the IR of voltage drop across the resistor $R_{fix}$, pins with an unacceptable high current leakage can be isolated from pins with an acceptable low current leakage. Acceptability can be determined by comparing the measured IR drop to a threshold or standard. Dies with an IR drop less than the standard may be accepted while those with a higher IR drop may be rejected.

This approach measures the leakage of two pins at one time. A testing process may be performed in at least two different ways. In one example, the observed voltage, $V_{sense}$, may be used to drive a higher or lower current, as seen through a feedback loop, to make the pin voltage reach the supply or ground voltage. This may be done directly using a PMU based analog measurement.

In a second example, the difference between the supply or ground voltage and the observed pin voltage can be noted and kill limits corresponding to the noted IR drop can be used. The voltage difference can be measured as the IR drop based on the pin location. That data collected across a statistically significant volume of parts can be used to determine appropriate kill limits based on the IR drop for each pin location. The kill limits may serve as maximum and minimum thresholds for a pass/fail test. This second example avoids applying a strong current through components that may be damaged by reverse biasing or exceeding junction voltage limits. The second example is particularly useful in cases where high voltage tolerant thick gate devices are not readily available.

Figure 2:
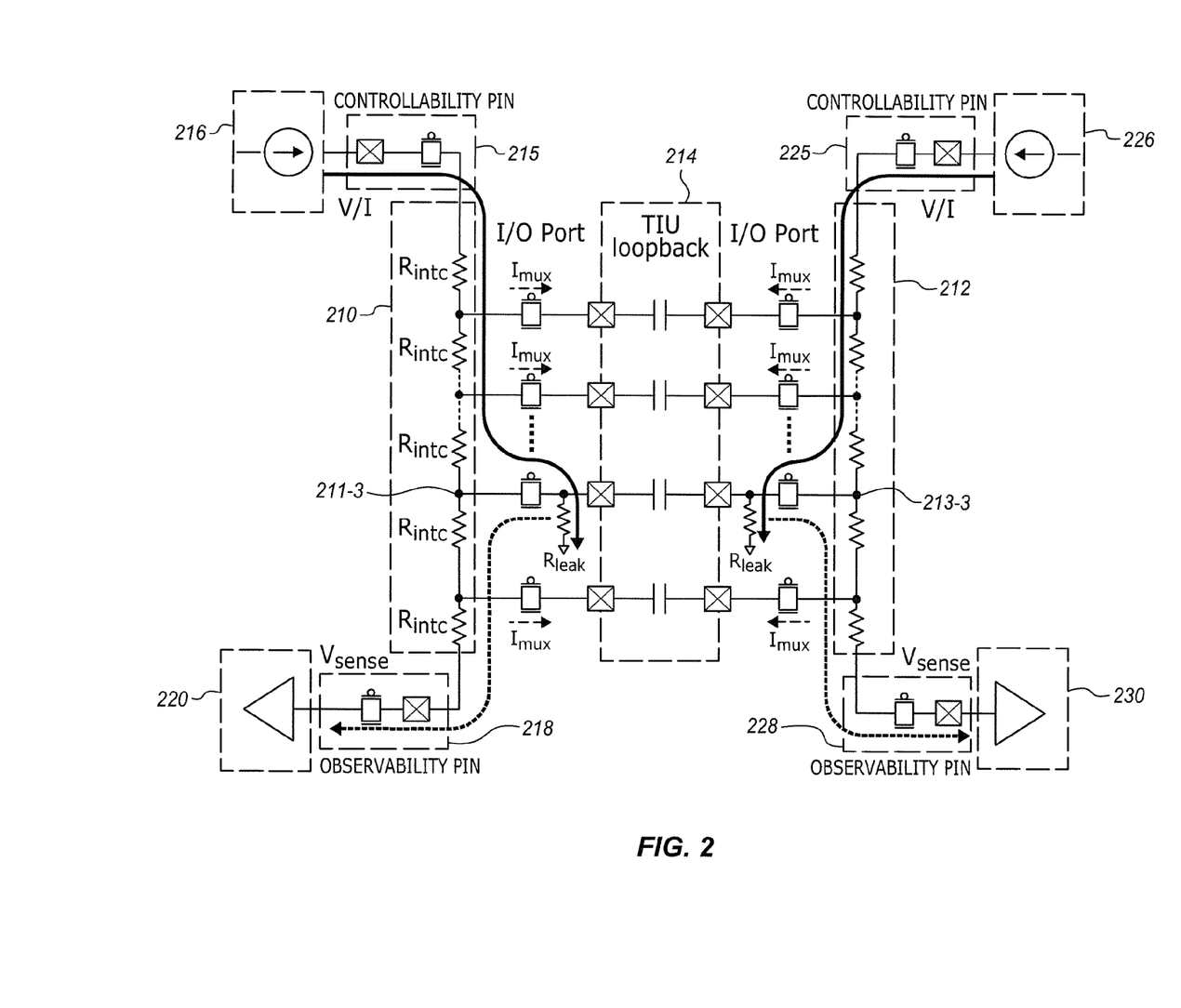
FIG. 2 is a diagram of an AC test equipment configuration for a data interface according to an embodiment of the invention.

FIG. 2 shows a configuration particularly suitable for an AC coupled near end loopback test which includes the use of a second observability pin for each analog test bus. An AC coupled near end loopback test is well suited for high speed data communications buses such as PCIe (Peripheral Component Interconnect Express) and SATA (Serial Advanced Technology Attachment), however, the test may be used for a variety of other data communications interfaces as well. The measurement method may be the same as in FIG. 1. In the illustrated example, a transmit interface 210 and a receive interface 212 of a data communications bus are coupled together through a TIU loopback device 214. For the AC test, the TIU has capacitors between each transmit pin 211-3 and its corresponding receive pin 213-3. As an AC coupling capacitor cannot conduct DC current, the observability pin is placed on the same side of the IOLB connection. As shown, a test DC voltage source 216 is coupled through a controllability pin 215 to one or more of the transmit pins 211. Similarly a second test voltage source 226 is coupled through a corresponding controllability pin 225 to one or more of the receive pins 213. Each side also has an observability pin. A first voltage detector 220 is coupled through an observability pin 218 to one or more of the transmit pins 211. A second voltage detector 230 is coupled through a second observability pin 228 to one or more of the receive pins 213. The use of two parallel current paths also reduces the overall IR drop.

If there is a method to bypass the AC coupling capacitors in the TIU, then the DC coupled configuration of FIG. 1 can be used for these tests instead of the configuration of FIG. 2. This adds complexity to the TIU but saves on package pins. If there is no IOLB, then the DC testing of FIG. 1 can be performed with the same controllability and observability pin configuration as shown in FIG. 2. If there are analog routes and pins available, the configuration of FIG. 2 may be used for a DC coupled TIU configuration as it would minimize the IR drop for the same interconnect routing resistance.

Figure 3:
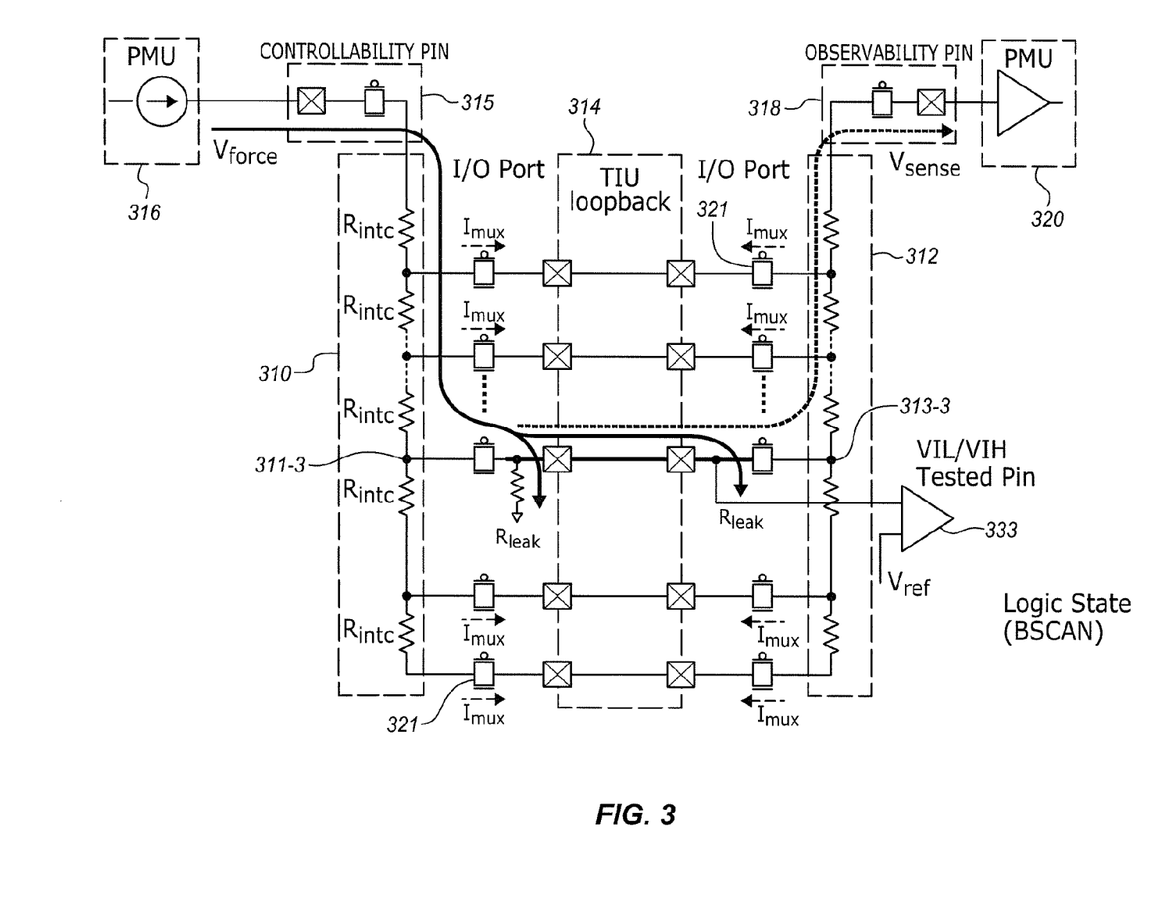
FIG. 3 is a diagram of a Vix test equipment configuration for a data interface according to an embodiment of the invention.
Figure 4:
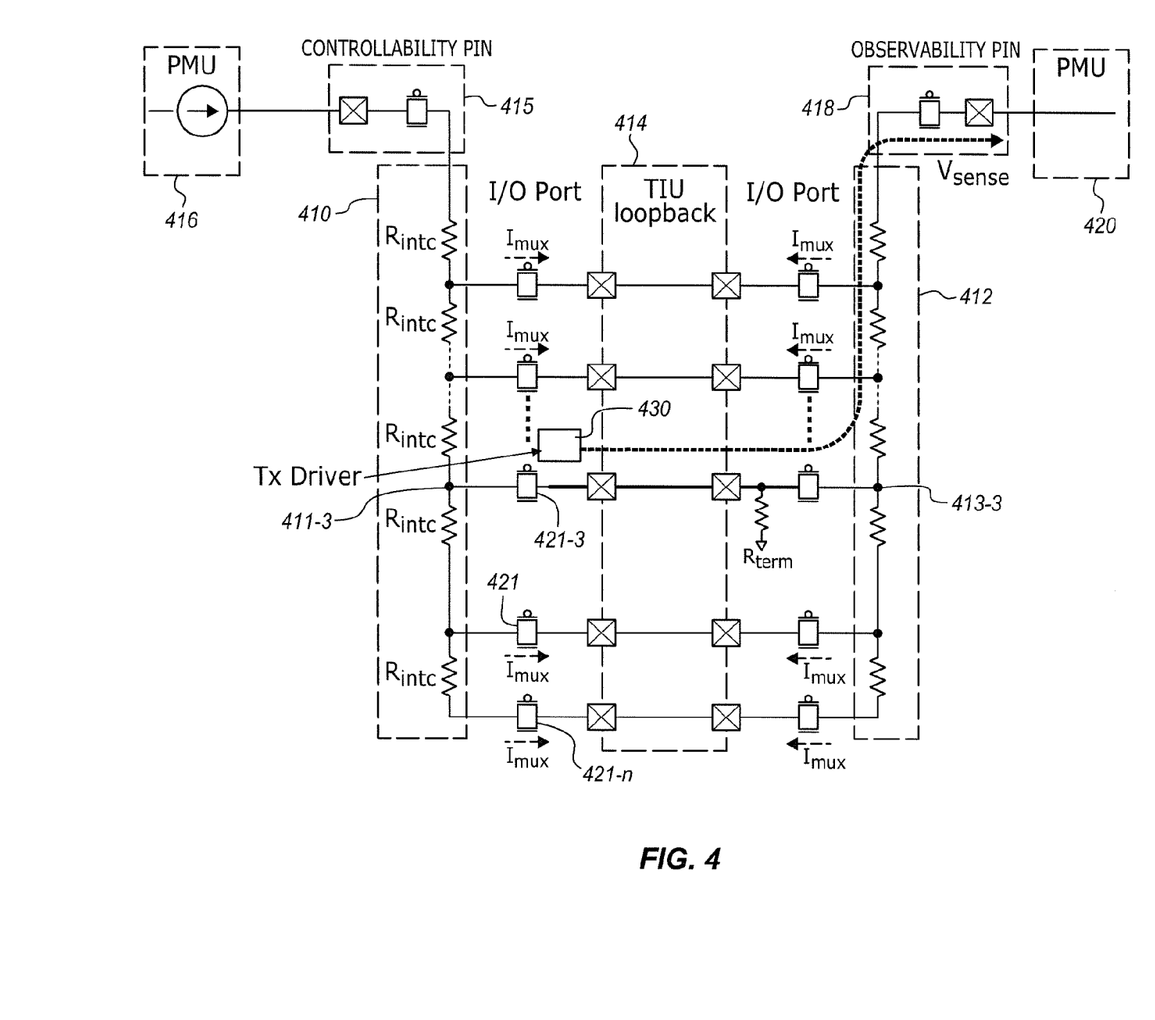
FIG. 4 is a diagram of a Vox test equipment configuration for a data interface according to an embodiment of the invention.

FIGS. 3 and 4 show Vix/Vox testing in the DC coupled TIU configuration. These tests may be performed before loopback tests to sort out defective dies without any further test time and expense. In FIG. 3, an external tester 316 forces a voltage $V_{force}$ to a controllability pin 315 which applies the forced voltage to one or more of the transmit pins 311 of the transmit side 310 of a data communications interface. The voltage is detected on pins 313 on the receive side 312 of the bus through an observability pin 318. The observability pin conducts the voltage to a voltage detector 320. A TIU loopback 314 connects each transmit pin 311 to its corresponding receive pin 313 on the same interface. The transmitters are disabled and only the loads are enabled.

The forced voltage is applied to one or more transmit pins, such as the indicated third pin 311-3 through the analog test bus with interconnect resistance, $R_{int}$. The voltage source supplies current to the pin under test and various sources of leakage in the analog test bus including the multiplexor leakage current, $I_{mux}$, through the pass gates 321 and the controllability and observanility pin leakage current, $R_{leak}$. The sensed voltage at the transmit pin or at the receive pin through the TIU loopback, as shown in FIG. 3, is sensed by the observability pin and compared to the forced voltage at the external tester 320.

For a Vix test, the input voltage required to trigger a high and low digital signal transition threshold is determined. The sensed voltage is increased by increasing the forced voltage and the voltage at the transmit pin is applied to a comparator 333 coupled in this example at the receive end of the TIO loopback. The comparator compares this voltage to an input reference voltage and the result of the comparison is captured in a boundary scan circuit or any other scan chain. When the voltage reaches the threshold, then the comparator signals the transition and this is correlated to the input voltage. This is the minimum voltage to trigger a transition from low to high. The test is repeated with a high sensed voltage which is reduced until the boundary scan signals a transition from high to low. The corresponding voltage is then the maximum voltage to trigger the transition. The trip point of the receiver will be adjusted by the IR drop, as measured via the observability pin. To enhance accuracy, all of the pass gates 321 may be disabled except for that one coupled to the tested pin and the forced voltage is applied across all of the pass gates. All receivers can be tested in parallel in this particular test to save test time.

In FIG. 4, a Vox test may be performed to determine the minimum and maximum transition voltages for each output pin. In FIG. 4, a test signal generator 416 is coupled through a controllability pin 415 to one or more pins 411 of the transmit side 410 of a data communications bus. All the multiplexors on the transmit side are disabled in this test. The purpose of the signal generator at 416 is to drive the same voltage that the actual transmitter would be driving on the controllability pin side of the analog test bus in order to eliminate the multiplexor leakage. The transmit pins are coupled through a TIU loopback 414 to corresponding receive pins 413 on the receive side 412 of the data communications bus. The sensed voltage is detected by an observability pin 418 and measured at a voltage detector 420 of an external tester. All the transmitters are enabled at the same time and driving the same voltage but only the transmitter which is being tested will have its receive side of the multiplexor enabled. The loads at the transmitter and receiver are enabled even though the receiver amplifier itself may be disabled.

For the Vox test, the high and low transmission limits of the transmitter side of the bus are measured. A transmit driver 430 is applied to the pass gate 421-3 of a selected pin 411-3 of the transmit side 410 of the bus. As in the other figures, there is a pass gate for each pin numbered from 421-1 to 421-n. The transmit driver drives a range of voltages on the transmitter pin. The voltage resulting from the transmit driver voltage is sensed by the observability pin 418 that is coupled to the voltage detector 420 of an external tester.

Calibration

Figure 5:
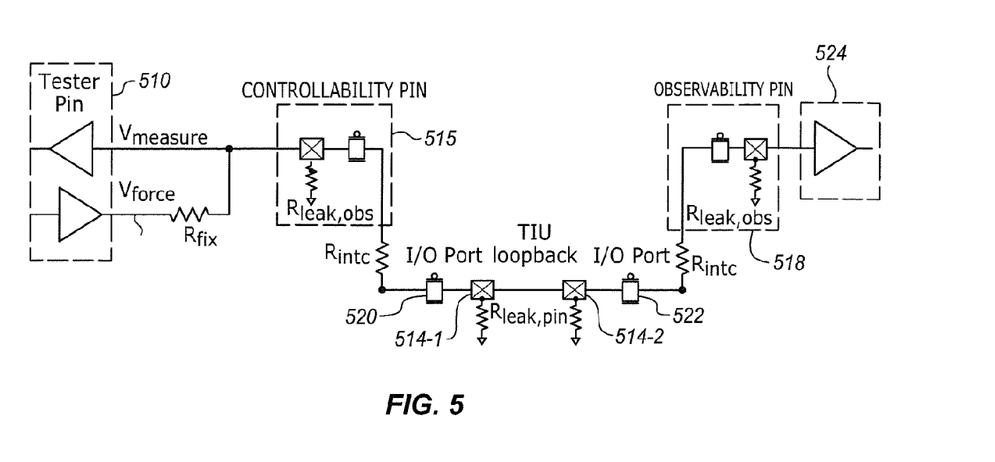
FIG. 5 is a virtual hardware diagram to show leakage paths in the test equipment of FIG. 1 according to an embodiment of the invention.

The results of the tests described above are enhanced by calibrating the system in advance. FIG. 5 is simplified diagram of the test structure used in the examples above. The test voltage driver 510 is coupled through a controllability pin 515 through a multiplexer 520 to an I/O port. The I/O port is coupled through a TIU loopback with an input connector 514-1 and an output connector 514-2. The loopback is coupled to a multiplexer 522 of the corresponding receive I/O port. This port is coupled to an observability pin 518 which is coupled to a voltage detector 524.

FIG. 5 shows leakage throughout the test structure. There is a leakage $R_{leak,ctrl}$ at the controllability pin and a corresponding leakage $R_{leak,obs}$ at the observability pin. There is an interconnect resistance $R_{int}$ of the analog test bus that connects the I/O ports, a leakage $R_{leak,pin}$ at the TIU loopback connectors. This structure may be calibrated in two steps. The first step is measuring the controllability and observability pin leakage and the second step is to determine the corresponding IR drop.

The IR drop can be accurately determined using, for example, an assumption that the observability and controllability pin leakage is close to zero or in other words that it is a small fraction of the total I/O leakage being measured. Alternatively the IR drop can be determined based on the assumption that the interconnect path from controllability pin to transmit pin is symmetric with the interconnect path from receive pin to observability pin i.e. $R_{intc,tx}=R_{intc,rx}=R_{intc}$. The calibration described herein relies on the observability pin. However, after calibration is completed;

the observability pin can be used as a controllability pin. This would reduce the IR drop by half. Alternatively, it may be disconnected.

Figure 6:
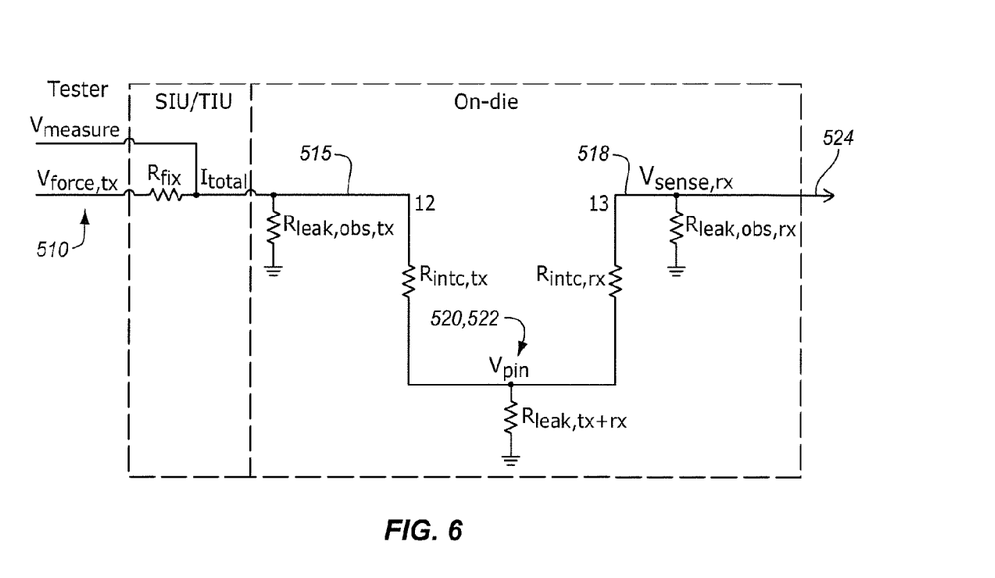
FIG. 6 is a virtual circuit diagram of the hardware of FIG. 5 according to an embodiment of the invention.

FIG. 6 shows the components of FIG. 5 as an electrical circuit instead of a hardware diagram. This allows the relationship between all of the parasitic and leakage effects to be seen more clearly. In addition, terminology is shown for each effect to aid in understanding the operations and equations described below. The leakage effects are labeled using the same nomenclature as in FIG. 5 to indicate the same effects. In addition, item reference numbers from FIG. 5 are applied for reference.

The observability and controllability pin leakage may be determined by starting with an assumption that $V_{force}$, $V_{measure}$, $R_{fix}$, $I_{total}$ and $V_{sense,rx}$ are all known quantities.

The calibration operation is as follows:
1. Turn off all muxes.
2. Drive $V_{measure}$=Vcc/Vss on the other side of the multiplexer. This removes the multiplexer leakage component.
3. Measure $I_{leak,obs,tx}$ as this equals $(V_{force}-V_{measure})/R_{fix}$ and then $R_{leak,obs,tx}=V_{measure}/I_{leak,obs,tx}$ The IR drop may be determined using either of the two following cases, depending on the particular application:

Case 1: $V_{pin}=V_{sense,rx}$ only if $I_{leak,obs,rx} \to 0$ i.e. there is no IR drop across $R_{intc,rx}$
1. $I_2=I_{total}-V_{measure}/R_{leak,obs,tx}$
   a. Do not use $I_{leak,obs,tx}$ as it will change depending on $V_{measure}$.
2. $R_{intc,tx}=(V_{measure}-V_{sense,rx})/I_2$
3. Since the on-die implementation is symmetric, the same $R_{fix}$ setup can be created on the receive side of the interface to determine $I_{leak,ob,rx}$ and $R_{leak,obs,rx}$ and $R_{intc,rx}$.

Case 2: $I_{leak,obs,rx} \neq 0$
1. Eq 1: $(V_{pin}-V_{sense,rx})/R_{intc,rx}=V_{sense,rx}/R_{leak,obs,rx}$
   a. $V_{pin}=V_{sense,rx}(R_{intc,rx}/R_{leak,obs,rx}+1)$
2. Eq 2: $I_2=(V_{measure}-V_{pin})/R_{intc,tx}$
3. Subs for $V_{pin}$ from Eq 1 in Eq 2:
4. $I_2=(V_{measure}-(V_{sense,rx}(R_{intc,rx}/R_{leak,obs,rx}+1))/R_{intc,tx}$
5. Expanding: $I_2*R_{intc,tx}*R_{leak,obs,rx}=(R_{leak,obs,rx}*V_{measure}-(V_{sense,rx}(R_{intc,rx}+R_{leak,obs,rx})))$
6. Assuming $R_{intc,tx}=R_{intc,rx}=R_{intc}$
7. $R_{intc}=(V_{measure}-V_{sense,rx})*R_{leak,obs,rx}/(I_2*R_{leak,obs,rx}+V_{sense,rx})$
8. $V_{pin}=V_{measure}-I_2*R_{intc}$ The assumption in line 6 above can be verified post-silicon by forcing the same voltage on the controllability and observability pin at the same time and measuring the ratio of the measured currents. The derivation of this calibration is shown below.

$$V_{pin}=V_{controllability}-I_{leakpin,tx}*R_{intc,tx}$$

The measurement on the observability side, when voltage is driven on that pin, is the mirror image of the controllability pin and can be written as:

$$V_{pin}=V_{observability}-I_{leakpin,rx}*R_{intc,rx}$$

$V_{controllability}=V_{observability}$ and Equating the above equations, we get $R_{intc,tx}/R_{intc,rx}=I_{leakpin,rx}/I_{leakpin,tx}$ Calibration allows information to be gathered on the variability of measurements across a statistically significant volume of parts and allows appropriate kill limits to be determined for high volume testing. The calibrations described above use three pin connections to the tester for each controllability and observability pair with the $V_{force}$ pin being shared. Sharing reduces the current drive capability of the tester especially in the context of testing leakages on multiple pins at one time. In some applications four pins may be used to avoid sharing and allow higher currents. Accordingly, the number of pins may be adapted to suit each testing sequence and for each interface.

Calibration allows information to be gathered on the variability of measurements across a statistically significant volume of parts and, using that information, to determine appropriate kill limits for high volume manufacturing. Without calibration the time to test each die can be reduced still further. The tester channels can be shared and the number of tester channels required with and without calibration would be 2. However three pins may be used to avoid the use of switches required for channel sharing or for reducing the IR drop on the analog test bus. The observability pin can be overloaded to drive current through the interface after calibration is completed.

On the other hand, calibration allows more precise kill limits to be set which can compensate for increases in controllability/observability pin leakage. The calibration allows for a more accurate characterization of the leakage which allows dies to be screened more accurately. By calibrating using only some of the parts in any particular batch, the time used for calibration can be reduced while most of the benefits of improved accuracy are retained.

Methodology

Figure 7:
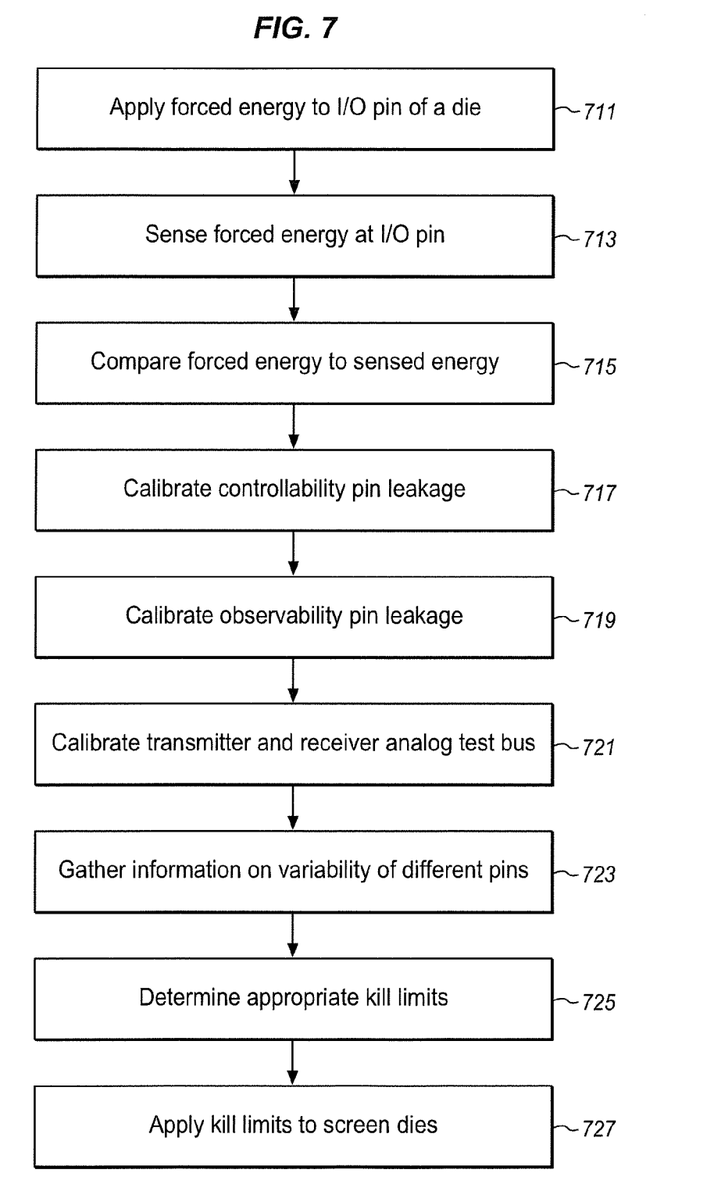
FIG. 7 is a process flow diagram of performing a pin leakage test according to an embodiment of the invention.

The processes described above can be reduced to a generalized methodology as shown in FIG. 7. First at 711 a forced energy is applied to one or more pins of a data communications bus. This forced energy may be a voltage or a current. In the described embodiments, the energy is applied through a multiplexer. In the described test hardware, each pin is coupled to a multiplexer. The multiplexers are controllable to determine to which pin the forced energy is applied. The multiplexers are coupled to a controllability pin so that the forced energy can be applied directly to the controllability pin and then the multiplexers can be switched to apply the forced energy to any desired pin of the transmit bus or the receive bus.

At 713, the energy caused by the forced energy is sensed at a second pin of the data communications interface. In the illustrated embodiments, the energy is sensed through an observability pin and the energy is typically a voltage.

At 715, the forced energy and the sensed energy are compared to determine an amount of current leaked by at least a portion of the interface. To enhance the accuracy of the comparison, if the forced energy is applied to less than all of the pins through the multiplexers, then the other multiplexers may be disabled so that they do not affect the reading. In addition to disabling the multiplexers, the forced energy may also be applied to each of the disabled multiplexers. This can be used to establish the same potential or voltage across all of the multiplexers which balances out any leakage current through the multiplexers, shown as $I_{mux}$ in the figures.

At 717, the observability pin can be calibrated by disabling a plurality of the multiplexers, driving a voltage onto the disabled multiplexers, and measuring current leaked through the observation pin.

At 719, the calibration process can be repeated by calibrating other different observability pins. The pins may be other pins of the same interface on the same die or pins of other dies having the same or a similar interface. At 721 additional calibration can be performed on the transmitter and receiver analog test bus. One such calibration is to determine a resistance mismatch on the analog test bus between the transmitter and receiver as shown above as Case 2.

The calibrations are then collected together at 723 for a plurality of interfaces. This provides information on the variability of measurements across all of observability pins.

At 725, appropriate kill limits are determined using the gathered information, and at 727 these kill limits may be used to screen additional dies.

General Considerations

As described above, the present invention allows for an observability port to be added to a test configuration in one or more different places. The observability port allows the tests to be compensated for IR drops that occur throughout the interface. The observability pins allow DC test methodologies to be modified to reduce the number of multiplexers used in the test bus to connect various I/O's leakage. The multiplexers can be turned off and driven to an equipotential value to virtually eliminate this source of error.

Calibration algorithms may be used to remove various sources of error including observability and controllability pin leakages, multiplexor leakages and interconnect IR drops. The calibration can be applied to test and screen dies in the context of high volume manufacturing or in developing appropriate kill limits through Design Validation (DV) on a statistically significant volume. As a result of avoiding time consuming calibration on every die or on failed dies in high volume manufacturing, the time to test each die can be reduced significantly. Test time may be reduced by using less time to switch relays of external test equipment and by making pass or fail decision on tested parts using patterns based on the calibrations.

In the description above, an analog test bus can be leveraged for DC testing and extended for application in high volume manufacturing. An observability port is added to the test apparatus to compensate for IR drops. The described I/O DC test methodology reduces multiplexer leakage. This is the multiplexer used into connect various I/O connectors to each other. A calibration algorithm is used to remove many different sources of error including observability and controllability pin leakage and interconnect resistance. In addition, these techniques are applied to screening out methodology dies in high volume manufacturing before they are subjected to more complex or expensive tests.

The techniques described herein may be used in a wide range of different low leakage I/O interfaces including like CMOS (Complementary Metal Oxide Semiconductor), GPIOs (General Purpose I/Os), TAP (Test Access Port), On Package I/Os, and Serial I/O's like QPI, SATA, and PCIe with lower leakage kill limits. As the leakage kill limits are lowered, the analog test bus will continue to find more applications because of the high accuracy that it is capable of achieving with low complexity, and fast test times.

It is to be appreciated that a lesser or more equipped system than the examples described above may be preferred for certain implementations. Therefore, the configuration of the exemplary systems and circuits may vary from implementation to implementation depending upon numerous factors, such as price constraints, performance requirements, technological improvements, or other circumstances.

Embodiments may be implemented as any or a combination of: one or more microchips or integrated circuits interconnected using a motherboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The invention claimed is:

1. A method comprising:
    applying a forced energy from an external tester to a controllability pin of an analog test bus of an integrated circuit on a die;
    setting a selected one of a plurality of pass gates of a multiplexer between the controllability pin and a selected first one of a plurality of interface pins of a data communications input/output bus interface of the integrated circuit on the die to select the first one of the plurality of interface pins and to apply the formed energy to the selected interface pin;
    sensing the energy caused by the forced energy at the external tester from a second interface pin of the data communications input/output bus interface; and
    comparing the forced energy and the sensed energy to determine an amount of current leaked by at least a portion of the interface.

2. The method of claim 1, wherein the forced energy is a forced current and the sensed energy is a sensed voltage.

3. The method of claim 1, wherein the forced energy is a forced voltage and the sensed energy is a sensed voltage.

4. The method of claim 1, further comprising disabling the pass gates of the multiplexer for interface pins other than the selected interface pin and driving the forced energy also to the disabled pass gates.

5. The method of claim 1, wherein the forced energy is a forced voltage and the sensed energy is a sensed voltage and wherein sensing the voltage comprises sensing the voltage through an observability pin, the method further comprising calibrating the observability pin by:
   disabling a plurality of the multiplexer pass gates;
   driving a voltage onto the disabled multiplexer pass gates; and
   measuring current leaked through the observability pin.

6. The method of claim 5, further comprising:
   repeating calibrating an observability pin to calibrate a plurality of different observability pins on a plurality of interfaces to gather information on the variability of measurements across the plurality of different observability pins;
   determining appropriate kill limits using the gathered information;
   applying the kill limits to screen additional dies.

7. The method of claim 1, wherein a loopback circuit is connected to the first pin to loopback signals from the first pin to the second pin.

8. The method of claim 1, wherein a loopback circuit is connected to the first pin to loopback signals from the first pin to a third pin and wherein the method further comprises disconnecting the loopback connection before applying the forced energy.

9. The method of claim 1, wherein the first pin is one of a transmit pin and a receive pin and the second pin is the other of a transmit pin and a receive pin.

10. An apparatus comprising:
    a controllability pin of an analog test bus of an integrated circuit die to allow an external forced energy from an external tester to be applied to a plurality of transmit pins and a plurality of receive pins of a data communication input/output bus of the integrated circuit die;
    a plurality of pass gates of a multiplexer of the integrated circuit die to connect the controllability pin to a selected first one or more of the pins of the input/output bus to apply the forced energy to the selected first pin;
    an observability pin of the integrated circuit die coupled to a selected second one of the pins of the input/output bus; and
    a detector of the external tester to sense energy at the observability pin and to compare the sensed energy to the forced energy and to determine a leakage of the input/output bus.

11. The apparatus of claim 10, wherein the controllability pin is coupled to a transmit pin on a transmit side of the input/output bus and the observability pin is coupled to a corresponding receive pin on a receive side of the input/output bus, the apparatus further comprising a tester interface loopback unit and wherein the transmit and receive sides of the input/output bus are coupled together through the tester interface unit loopback unit.

12. The apparatus of claim 10, wherein the controllability pin is coupled to a transmit in of the input/output bus and the observability pin is coupled to the transmit pin of the input/output bus.

13. The apparatus of claim 12, further comprising an alternating current coupled loopback tester interface unit to connect the transmit pin to a receive pin for alternating current.

14. The apparatus of claim 10, wherein the forced energy is a forced voltage.

15. The apparatus of claim 14, wherein the sensed energy is a sensed voltage.

16. The apparatus of claim 10, further comprising a fixture resistor between the forced energy and the controllability in to allow a voltage leakage to be measured across the fixture resistor.

17. An apparatus comprising:
    a data communications input/output bus of an integrated circuit on a die, the bus having a plurality of transmit pins and a plurality of receive pins;
    a switchable loopback connector on the die to couple transmit pins of the bus to corresponding receive pins;
    a controllability pin on the die to allow an external forced voltage to be applied to the bus;
    a plurality of pass gates of a multiplexer to connect the controllability pin to a first pin of the bus;
    an observability pin on the die coupled to a second pin, the second in coupled to the first pin through the loopback connector; and
    an external detector to sense voltage at the observability pin and to compare the sensed voltage to the forced voltage and to determine a leakage of the bus.

18. The apparatus of claim 17, further comprising a fixture resistor between the forced voltage and the controllability pin to determine a voltage drop through the data bus.

19. The apparatus of claim 17, wherein the loopback connector comprises switchable capacitors between respective receive and transmit pins of the data bus, and wherein the controllability pin allows an alternating current voltage to be applied to the bus.

* * * * *

UNITED STATES PATENT AND TRADEMARK OFFICE
CERTIFICATE OF CORRECTION

PATENT NO. : 9,551,741 B2  
APPLICATION NO. : 13/977648  
DATED : January 24, 2017  
INVENTOR(S) : Thiruvengadam et al.

Page 1 of 1

It is certified that error appears in the above-identified patent and that said Letters Patent is hereby corrected as shown below:

In the Claims

Column 12, Line 22, Claim 16 delete "in" and insert --pin--.

Column 12, Line 36, Claim 17 delete "in" and insert --pin--.

Signed and Sealed this  
Fourth Day of April, 2017

Michelle K. Lee  
*Director of the United States Patent and Trademark Office*